(12) United States Patent
Deng et al.

(10) Patent No.: US 10,268,094 B1
(45) Date of Patent: Apr. 23, 2019

(54) ARRAY SUBSTRATE, DISPLAY PANEL AND METHOD OF MANUFACTURING ARRAY SUBSTRATE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Zhuming Deng, Guangdong (CN); Minggang Liu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/742,515

(22) PCT Filed: Dec. 6, 2017

(86) PCT No.: PCT/CN2017/114701
§ 371 (c)(1),
(2) Date: Jan. 7, 2018

(30) Foreign Application Priority Data

Nov. 17, 2017 (CN) .......................... 2017 1 1143426

(51) Int. Cl.
*G02F 1/1362* (2006.01)
*H01L 27/12* (2006.01)
*G02F 1/1343* (2006.01)
*G02F 1/1335* (2006.01)
(Continued)

(52) U.S. Cl.
CPC .... *G02F 1/136286* (2013.01); *G02F 1/13439* (2013.01); *G02F 1/133345* (2013.01); *G02F 1/133514* (2013.01); *G02F 1/134309* (2013.01); *H01L 27/124* (2013.01); *H01L 27/1248* (2013.01); *H01L 27/1262* (2013.01); *G02F 1/1336* (2013.01); *G02F 2001/136218* (2013.01); *G02F 2001/136295* (2013.01)

(58) Field of Classification Search
CPC ................................................ G02F 1/136286
See application file for complete search history.

(56) References Cited

U.S. PATENT DOCUMENTS

| 2014/0264606 A1* | 9/2014 | Chiang | ............... H01L 27/1218 257/350 |
| 2016/0195788 A1* | 7/2016 | Bae | ..................... G02F 1/13624 257/72 |

* cited by examiner

*Primary Examiner* — Edmond C Lau
(74) *Attorney, Agent, or Firm* — Hauptman Ham, LLP

(57) ABSTRACT

An array substrate, a display panel and a method of manufacturing array substrate are provided. The array substrate, comprising first substrate and data line, data line positioned on first substrate; auxiliary electrode positioned on first substrate, auxiliary electrode for electrically connecting to color filter, vertical projection of auxiliary electrode on first substrate does not intersect with data line; insulating layer positioned on surface of auxiliary electrode which away first substrate, insulating layer has hole; and shielding electrode comprises main section and protrusion section are integrated, main section is located on lateral side of data line which away first substrate, and vertical projection of main section on first substrate is covering data line, protrusion section is positioned on insulating layer, and protrusion section pass through hole and contacting to auxiliary electrode. It achieves to highly product yield and saving production costs.

12 Claims, 4 Drawing Sheets

(51) Int. Cl.
*G02F 1/1333* (2006.01)
*G02F 1/13357* (2006.01)

ARRAY SUBSTRATE, DISPLAY PANEL AND METHOD OF MANUFACTURING ARRAY SUBSTRATE

RELATED APPLICATIONS

The present application is a National Phase of International Application Number PCT/CN2017/114701, filed Dec. 6, 2017, and claims the priority of China Application No. 201711143426.2, filed Nov. 17, 2017.

FIELD OF THE DISCLOSURE

The disclosure relates to a liquid crystal display technical field, and more particularly to an array substrate, a display panel and a method of manufacturing array substrate.

BACKGROUND

Polymer Stabilized Vertically Aligned (PSVA) module liquid crystal display panel is using the vertical electric field in vertical direction to driving liquid crystal molecule which perpendicular positioned on the glass substrate, such that forming copolymer stable and perpendicular arrangement on the liquid crystal display panel. In this module liquid crystal display panel, its will be black display status without apply voltage; while apply a certain voltage, the liquid crystal molecular of the crystal liquid display panel is turn to horizontal direction, in this module liquid crystal display panel will be white display status. Currently, in order to avoid the light leakage of the liquid crystal display panel caused by curving black matrix, the existing PSVA module liquid crystal display panel is formed a shielding electrode on the data line, the shielding electrode effective reduces the light leakage of the liquid crystal display panel. However, the shielding electrode totally covering the data line such that the shielding electrode easily be affected by high/low potential signal of the data line. Therefore, the common electrode between the shielding electrode and color filter has voltage difference causes the light leakage of the liquid crystal display panel.

In existing technology, a transverse electrode is disposed between two adjacent shielding electrodes, the transverse electrode is electrically connecting to the two adjacent shielding electrodes so that decreases voltage difference between each shielding electrodes, and keep stable voltage of the shielding electrode. Further, the transverse electrode is positioned between the adjacent pixel electrodes, the transverse electrode will bend toward to a pixel electrode for avoiding the thin film transistor positioned between the adjacent pixel electrodes such that pass through the metal gap between the pixel electrode and thin film transistor. Actually, the transverse electrode is too closed to the pixel electrode, it is easy to form ITO residue between pixel electrode and the transverse electrode while forming the pixel electrode and the transverse electrode by physical vapor deposition and etching indium tin oxide conducting layer. It causes the short circuit between the pixel electrode and the transverse electrode and effect normal working of pixel electrode.

SUMMARY

A technical problem to be solved by the disclosure is to provide an array substrate, a liquid crystal display panel and a method of manufacturing array substrate. It could solve the problem that the shielding electrode easily effected by high/low potential signal of data line in existing technology such that affect the normal working of shielding electrode.

An objective of the disclosure is achieved by following embodiments. In particular, a array substrate, comprising
a first substrate and a data line, the data line positioned on the first substrate;
an auxiliary electrode positioned on the first substrate, the auxiliary electrode for electrically connecting to a color filter, vertical projection of the auxiliary electrode on the first substrate does not intersect with the data line;
an insulating layer positioned on a surface of the auxiliary electrode which away the first substrate, the insulating layer has a hole; and
a shielding electrode comprises a main section and a protrusion section are integrated, the main section is located on a lateral side of data line which away the first substrate, and vertical projection of the main section on the first substrate is covering the data line, the protrusion section is positioned on the insulating layer, and the protrusion section pass through the hole and contacting to the auxiliary electrode.

In an embodiment, vertical projection of the protrusion section on the first substrate is covering the hole.

In an embodiment, the array substrate further comprising a pixel electrode positioned on the first substrate, at least partial vertical projection of the auxiliary electrode on the first substrate is positioned between the data line and the pixel electrode, the auxiliary electrode for decreasing effect of the pixel electrode by data line.

In an embodiment, the insulating layer includes a grid insulating layer and a passivation layer, the grid insulating layer and the passivation layer are sequentially stacked on the auxiliary electrode in vertical projection range of the protrusion section on the first substrate, the first substrate further comprising a thin film transistor, the grid insulating layer is positioned between a grid and a source, a drain of the thin film transistor, the passivation layer is positioned between the source or the drain of the thin film transistor and the pixel electrode.

According to another aspect of the disclosure, the disclosure further provides a display panel. The display panel, comprising a color filter, a crystal liquid layer and a array substrate, the array substrate comprising a first substrate and a data line, the data line positioned on the first substrate; an auxiliary electrode positioned on the first substrate, the auxiliary electrode for electrically connecting to the color filter, vertical projection of the auxiliary electrode on the first substrate does not intersect with the data line; an insulating layer positioned on a surface of the auxiliary electrode which away the first substrate, the insulating layer has a hole; and a shielding electrode comprises a main section and a protrusion section are integrated, the main section is located on a lateral side of data line which away the first substrate, and vertical projection of the main section on the first substrate is covering the data line, the protrusion section is positioned on the insulating layer, and the protrusion section pass through the hole and contacting to the auxiliary electrode; the color filter and the array substrate are corresponding to each other, the crystal liquid layer is positioned between the color filter and the array substrate, and changing deflection of the liquid crystal molecular of the liquid crystal layer according to differential pressure between the array substrate and color filter.

In an embodiment, vertical projection of the protrusion section on the first substrate is covering the hole.

In an embodiment, the array substrate further comprising a pixel electrode positioned on the first substrate, at least partial vertical projection of the auxiliary electrode on the first substrate is positioned between the data line and the pixel electrode, the auxiliary electrode for decreasing effect of the pixel electrode by data line.

In an embodiment, the insulating layer includes a grid insulating layer and a passivation layer, the grid insulating layer and the passivation layer are sequentially stacked on the auxiliary electrode in vertical projection range of the protrusion section on the first substrate, the first substrate further comprising a thin film transistor, the grid insulating layer is positioned between a grid and a source, a drain of the thin film transistor, the passivation layer is positioned between the source or the drain of the thin film transistor and the pixel electrode.

According to another aspect of the disclosure, the disclosure further provides a display apparatus, comprising a backlight module and a display panel according to claim 5, the backlight module is positioned on a lateral side of non-display surface of the liquid crystal display panel for providing back light source to display image of liquid crystal display panel.

According to another aspect of the disclosure, the disclosure further provides method of manufacturing array substrate, comprising providing a first substrate, forming a first metal layer on the first substrate, patterning the first metal layer to form an auxiliary electrode, the auxiliary electrode for electrically connecting the color filter;

forming a second metal layer on the first substrate, patterning the second metal layer to form data line, vertical projection of the data line on the first substrate does not intersect with the auxiliary electrode;

forming an insulating layer on a surface of the auxiliary electrode which away the first substrate, and opening a hole on the insulating layer;

forming a conducting layer on the first substrate, patterning the conducting layer to form a shielding electrode, the shielding electrode comprises a main section and a protrusion section are integrated, the main section is located on a lateral side of data line which away the first substrate, and vertical projection of the main section on the first substrate is covering the data line, the protrusion section is positioned on the insulating layer, and the protrusion section pass through the hole and contacting to the auxiliary electrode.

In an embodiment, before forming the data line, patterning the first metal layer to form a grid, and forming a grid insulating layer on the grid; while forming the data line, patterning a source and a drain of the second metal layer, the data line is electrically connecting with the source or the drain; after forming the data line, forming a passivation layer on the source and the drain, the grid insulating layer and the passivation layer are sequentially stacked on the auxiliary electrode to form the insulating layer.

In an embodiment, while patterning the conducting layer to form the shielding electrode, patterning the conducting layer to form a pixel electrode, at least partial vertical projection of the auxiliary electrode on the first substrate is positioned between the data line and the pixel electrode, the auxiliary electrode for decreasing effect of the pixel electrode by data line.

In an embodiment, vertical projection of the protrusion section on the first substrate is covering the hole.

The advantageous of this disclosure is: the main section of the shielding electrode covering data line for avoiding light leakage from liquid crystal display panel caused by black matrix, the protrusion section pass through the hole on the insulating layer for contacting and electrically connecting to the auxiliary electrode, such that electrically connecting to the common electrode of color filter substrate by the auxiliary electrode. According to that each shielding electrodes of the array substrate is electrically connecting to the common electrode, each shielding electrodes has same potential, reducing the effect of main section of the shielding electrode by high/low potential signal of the data line, the shielding electrode is normal working, highly product yield and saving production costs.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

Figure 1:
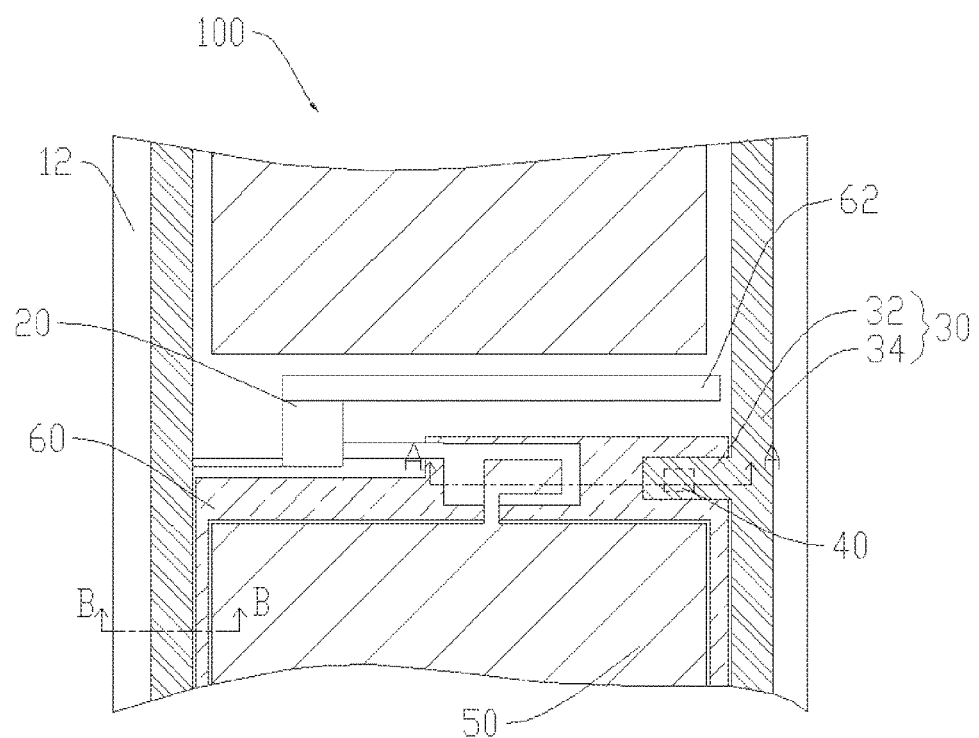
FIG. 1 is a structural schematic view of an array substrate according to an embodiment of the disclosure.
Figure 2:
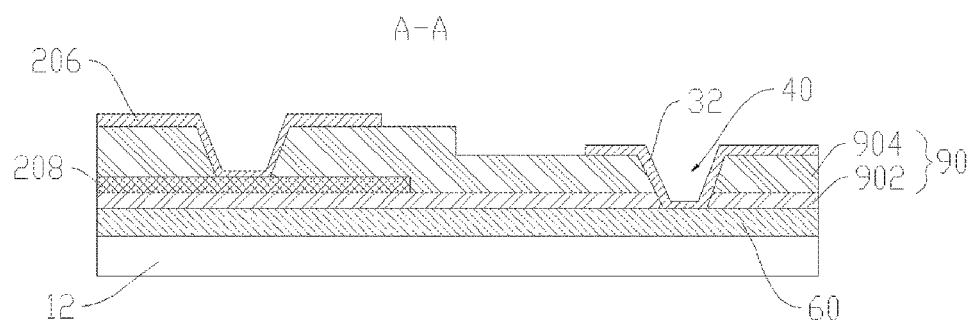
FIG. 2 is an A-A line cross-section schematic view of the array substrate according to an embodiment of the disclosure.
Figure 3:
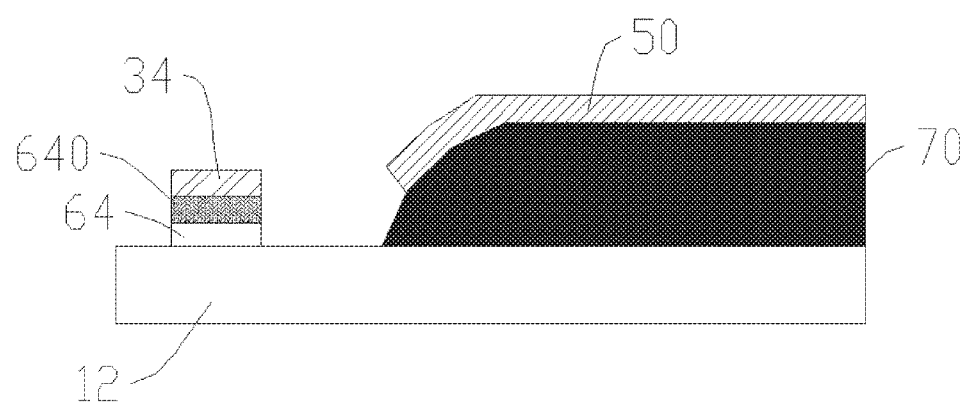
FIG. 3 is a B-B line cross-section schematic view of the array substrate according to an embodiment of the disclosure.

Please refer to FIG. 1, FIG. 2 and FIG. 3. This embodiment 1 of this disclosure provides an array substrate 100, comprising a first substrate 12, a thin film transistor 20, a data line 64, a scan line 62 and a pixel electrode 50. In this embodiment, the array substrate 100 is applied to a PSVA module liquid crystal display panel 200. Specifically, please refer to FIG. 1, the thin film transistor 20, the data line 64, the scan line 62 and the pixel electrode 50 are formed on the first substrate 12. A grid of the thin film transistor 20 is electrically connecting to the scan line 62, source and drain of the thin film transistor 20 are respectively connecting to one of the data line 64 and pixel electrode 50. In this embodiment, the data line 64 and the scan line 62 are interval arranged, the thin film transistor 20 and the pixel electrode 50 are located in a pixel region surrounding by the scan line 62 and the data line 64. It is noted that, the data line 64 of the FIG. 1 is shielded by a shielding electrode 30. In another embodiment, the first substrate 12 is a flat substrate made by transparent material such as glass substrate or plastic substrate.

In this embodiment, the array substrate 100 further comprising an auxiliary electrode 60 and the pixel electrode 50 are positioned on the first substrate 12. At least partial of vertical projected of the auxiliary electrode 60 on the first substrate 12 is located between the data line 64 and the pixel electrode 50. The auxiliary electrode 60 is use for decreasing effect to the pixel electrode 50 by the data line 64. In another embodiment, the array substrate 100 further comprises a transition conducting layer which connecting between the pixel electrode 50 and source or drain of the thin film transistor 20. At least partial of the auxiliary electrode 60 is facing to the source or the drain such that formed a storage capacitor. In another embodiment, surface of the auxiliary electrode 60 further comprises an insulating layer 90, the insulating layer 90 is covering the auxiliary electrode 60 for separating the auxiliary electrode 60 and the interval column or other structure for avoiding the auxiliary electrode 60 short-circuit with outside. In this embodiment, the auxiliary electrode 60 is using for electrically connecting to a color filter 140, and vertical projection of the auxiliary electrode 60 on the first substrate 12 does not intersect with the data line 64. Specifically, the auxiliary electrode 60 further electrically connecting to a driving circuit, the driving circuit provides a signal of controlling voltage of a common electrode 16, and transmits to the common electrode 16.

In this embodiment, the array substrate 100 further comprising an insulating layer 90, the insulating layer 90 is positioned on a surface of the auxiliary electrode 60 which away the first substrate 12, and the insulating layer 90 has a hole for exposing the auxiliary electrode 60. In other embodiment, the insulating layer 90 is positioned on surface of the auxiliary electrode 60 and covering the auxiliary electrode 60 for separating the auxiliary electrode 60 and outside, which avoid the auxiliary electrode 60 be short-circuit and causes bad effect. In this embodiment, the hole 40 is formed on the insulating layer 90, and exposed by the auxiliary electrode 60 which covered by the insulating layer 90.

Please refer to the FIG. 1 and FIG. 3. In this embodiment, the array substrate 100 further comprises the shielding electrode 30. The shielding electrode 30 comprises a main section 34 and a protrusion section 32 are integrated, the main section 34 is located on a lateral side of data line 64 which away the first substrate 12, and vertical projection of the main section 34 on the first substrate 12 is covering the data line 64. Further, the data line 64 and the main section 34 are insulating to each other. In other embodiment, the main section 34 is separated by the insulating layer 90. In this embodiment, the main section 34 is a strip-shaped, each of the main sections 34 of the shielding electrode 30 is covering to a data line 64 for reducing light leak phenomenon from lateral side of curving liquid crystal display panel 200. In this embodiment, the protrusion section 32 is positioned on the insulating layer 90, and the protrusion section 32 pass through the hole 40 and contacting to the auxiliary electrode 60. Specifically, the protrusion section 32 is extending from lateral side of the main section 34 and along the perpendicular direction of the main section 34. Further, the protrusion section 32 extending along an inner wall of the hole 40 to inside of the hole 40, protrusion section 32 pass the bottom of the hole 40 and contacting to the auxiliary electrode 60 which exposed by the hole 40. In other embodiment, the protrusion section 32 keep along the inner wall of the hole 40 to outside the hole 40 after contacting the auxiliary electrode 60 for enhancing the contacting area between the protrusion section 32 and the auxiliary electrode 60. In other embodiment, vertical projection of the protrusion section 32 on the first substrate 12 is covering the hole 40, in another way, the auxiliary electrode 60 which exposed by the hole 40 is contacting with the protrusion section entirely such that increase the contacting area between the protrusion section 32 and the auxiliary electrode 60.

The main section 34 of the shielding electrode 30 is covering the data line 64 for prevent light leakage from lateral side of liquid crystal display panel 200 caused by curving black matrix. The protrusion section 32 pass through the hole 40 of the insulating layer 90, and contacting and electrically connecting to the auxiliary electrode 60 such that the protrusion section 32 is electrically connecting to the common electrode 16 on the color filter 140 by the auxiliary electrode 60. According to that each of the shielding electrodes 30 on the array substrate 100 is electrically connecting to the common electrode 16, and each of the shielding electrodes 30 has same potential which reduces the effect of main section 34 of the shielding electrode 30 by the high/low potential signal on the data line 64, and then the shielding electrode 30 is normally working, and highly product yield and saving production costs.

In this embodiment, the array substrate 100 further comprises a thin film transistor 20 is stacked on a surface of the first substrate 12. The thin film transistor 20 includes a grid, a grid insulating layer 902, an active layer, a source and a drain and a passivation layer 904 by sequentially positioned. Specifically, the grid insulating layer 902 is positioned between the grid and the active layer for separating the grid and the active layer, which avoid the effect between the grid and the active layer, the passivation layer 904 is covering the source and the drain for protecting the source and the drain and entire thin film transistor 20. In other embodiment, the pixel electrode 50 is formed on the passivation layer 904 and opening an open on the correspondingly position of the source or drain for exposing partially source or drain, and pixel electrode 50 pass through the open to contact source or drain such that achieve to electrically connect the thin film transistor 20 and the pixel electrode 50. In this embodiment, in range of vertical projection of the protrusion section 32 on the first substrate 12, the grid insulating layer 902 and the passivation layer 904 are stacked on the auxiliary electrode 60. Specifically, the auxiliary electrode 60 and the grid are simultaneously formed by patterning the first metal layer which deposited on the first substrate 12. The source and the drain are formed by patterning the second metal layer which deposited on the first substrate 12. And in the covering range of the protrusion section 32, the second metal layer will be etched and removed, so that in the covering range of the protrusion section 32, the passivation layer 904 is positioned on surface of the grid insulating layer 902 and stacking with the grid insulating layer 902 to form an insulating layer 90. In other embodiment, the passivation layer 904 and the grid insulating layer 902 are formed by the same insulating material, or by the different insulating materials. Further, the hole 40 simultaneously passes through the passivation layer 904 and the grid insulating layer 902 for exposing the auxiliary electrode 60.

The main section 34 of the shielding electrode 30 is covering the data line 64 for prevent light leakage from lateral side of liquid crystal display panel 200 caused by curving black matrix. The protrusion section 32 pass through the hole 40 of the insulating layer 90, and contacting and electrically connecting to the auxiliary electrode 60 such that the protrusion section 32 is electrically connecting to the common electrode 16 on the color filter 140 by the auxiliary electrode 60. According to that each of the shielding electrodes 30 on the array substrate 100 is electrically connecting to the common electrode 16, and each of the shielding electrode 30 has same potential which reduces the effect of main section 34 of the shielding electrode 30 by the high/low potential signal on the data line 64, and then the shielding electrode 30 is normally working, and highly product yield and saving production costs.

Figure 4:
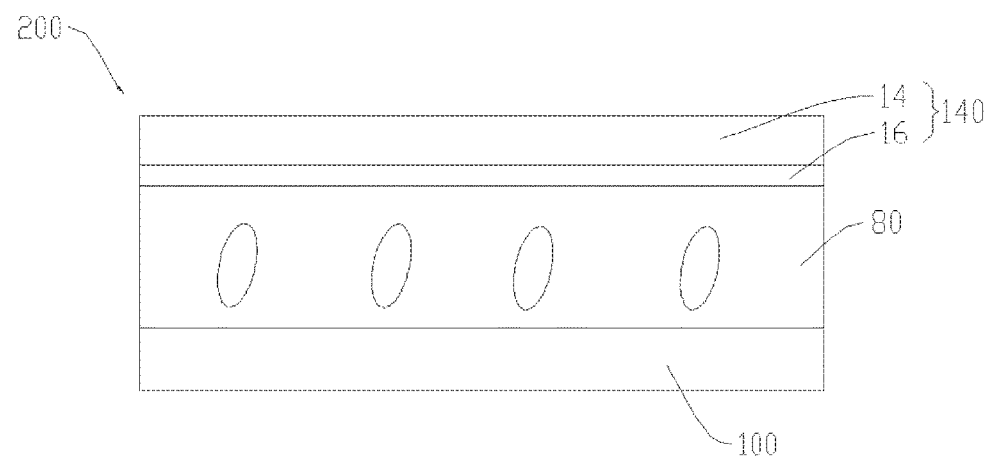
FIG. 4 is a schematic view of a display panel according to an embodiment of the disclosure.

Please refer to FIG. 4. The embodiment of the disclosure further provides a display panel 200 comprising a color filter 140, a crystal liquid layer 80 and the array substrate 100 provided by this embodiment of disclosure. The color filter 140 and the array substrate 100 are correspondingly positioned to each other, the crystal liquid layer 80 is positioned between the color filter 140 and the array substrate 100, and changing deflection of the liquid crystal molecular of the liquid crystal layer 80 according to differential pressure between the array substrate 100 and the color filter 140. In another embodiment, the display panel 200 could be a curving display panel 200. In another embodiment, the color filter 140 comprising a second substrate 14 and a common electrode 16, the second substrate 14 is correspondingly positioned to the first substrate 12, and the common electrode 16 is positioned on a side of the second substrate 14 which facing to the array substrate 100. The crystal liquid layer 80 is positioned between the pixel electrode 50 and the common electrode 16 and changing deflection of the liquid crystal molecular of the liquid crystal layer 80 according to differential pressure between the pixel electrode 50 and the common electrode 16. In another embodiment, the common electrode 16 is formed a conducting layer on surface of the first substrate 12 according to etching process. Actually, there are multiple contacting points on a sealant between the color filter 140 and the array substrate 100, which use for electrically connecting the shielding electrode 30, the auxiliary electrode on the array substrate 100 to the common electrode 16 on the color filter 140.

Figure 5:
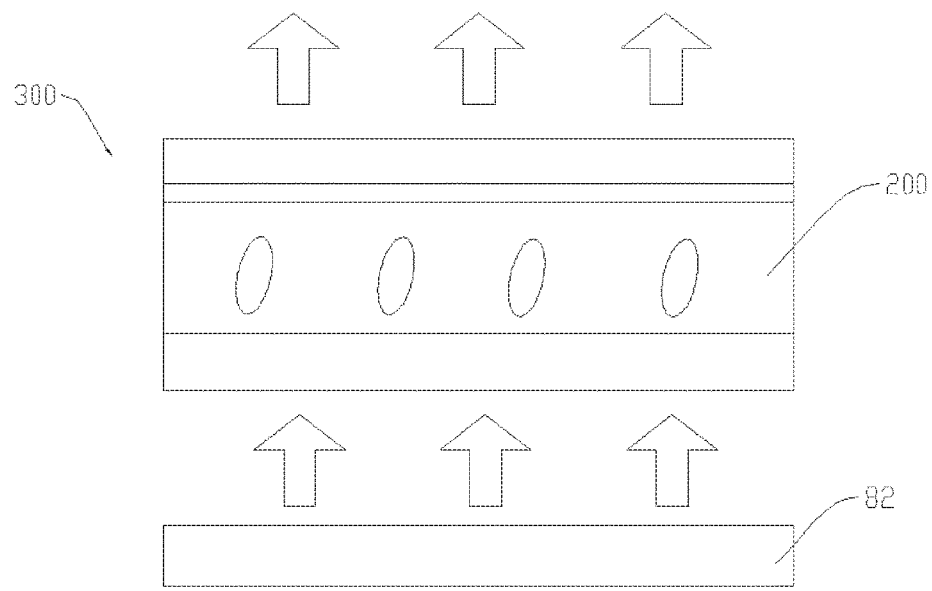
FIG. 5 is a schematic view of a display apparatus according to an embodiment of the disclosure.

Please refer to FIG. 5. The embodiment of this disclosure further provides a display apparatus 300 comprises a backlight module 82 and a liquid crystal display panel 200 of the embodiment in the disclosure. The backlight module 82 is positioned on a lateral side of non-display surface of the liquid crystal display panel 200 for providing back light source to display image of liquid crystal display panel 200. In another embodiment, the liquid crystal display apparatus 300 could be a curving display apparatus 300. In this embodiment, the liquid crystal display apparatus 300 is television, display device, mobile phone, tablet computer, notebook and so on.

The main section 34 of the shielding electrode 30 is covering the data line 64 for prevent light leakage from lateral side of liquid crystal display panel 200 caused by curving black matrix. The protrusion section 32 pass through the hole 40 of the insulating layer 90, and contacting and electrically connecting to the auxiliary electrode 60 such that the protrusion section 32 is electrically connecting to the common electrode 16 on the color filter 140 by the auxiliary electrode 60. According to that each of the shielding electrodes 30 on the array substrate 100 is electrically connecting to the common electrode 16, and each of the shielding electrode 30 has same potential which reduces the effect of main section 34 of the shielding electrode 30 by the high/low potential signal on the data line 64, and then the shielding electrode 30 is normally working, and highly product yield and saving production costs.

Please refer FIG. 6 to FIG. 9. The embodiment of this disclosure further provides a method of manufacturing array substrate 100. The specifically method comprising following steps.

S101, providing a first substrate 120, forming a first metal layer on the first substrate 12, patterning the first metal layer to form an auxiliary electrode 60, the auxiliary electrode 60 is used for electrically connecting the color filter 140.

Figure 6:
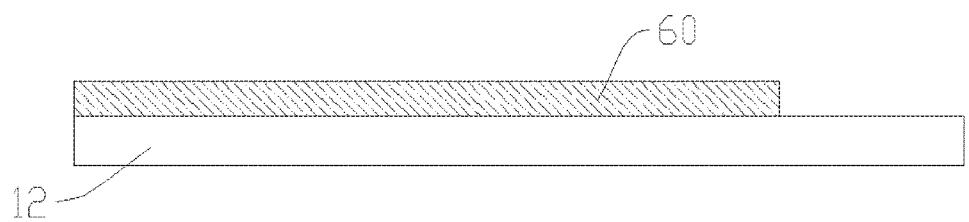
FIG. 6 is a Step S101 schematic view of a method of manufacturing array substrate according to an embodiment of the disclosure.

Please refer to FIG. 6, the first metal layer is formed by chemical vapor deposition, and patterning the first metal layer by etching process. In another embodiment, while forming the auxiliary electrode 60 by patterning the first metal layer, it also forming grid, and the grid and the auxiliary electrode 60 is not intersect.

S102, forming a second metal layer on the first substrate 12, patterning the second metal layer to form a data line 64, and vertical projection of the data line 64 on the first substrate 12 does not intersect with the auxiliary electrode 60.

Figure 7:
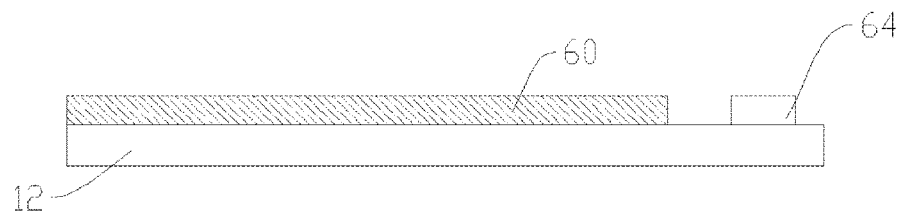
FIG. 7 is a Step S102 schematic view of a method of manufacturing array substrate according to an embodiment of the disclosure.

Please refer to FIG. 7, the second metal layer is formed by chemical vapor deposition, and patterning the second metal layer by etching process. In another embodiment, while forming the data line 64 by patterning the second metal layer, at the same time, it also forming source and drain, and the source or the drain is electrically connecting with the data line 64.

S103, forming an insulating layer 90 on a surface of the auxiliary electrode 60 which away the first substrate 12, and opening a hole 40 on the insulating layer 90 for exposing the auxiliary electrode 60.

Figure 8:
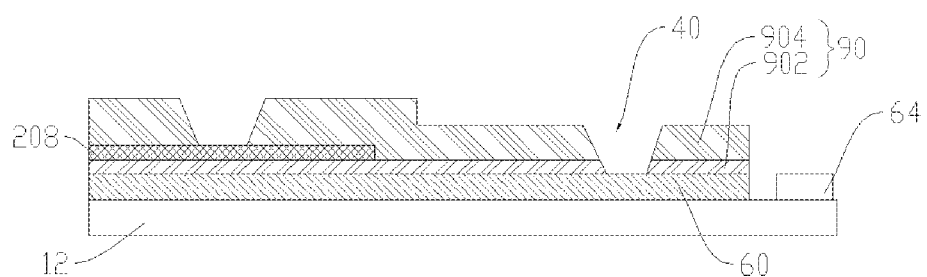
FIG. 8 is a Step S103 schematic view of a method of manufacturing array substrate according to an embodiment of the disclosure.

Please refer to FIG. 8. In this embodiment, the insulating layer 90 comprises the grid insulating layer 902 and the passivation layer 904. Specifically, before forming data line 64, patterning the first metal layer to form a grid and forming the grid insulating layer 902 on the grid. While forming the data line 64, patterning a source and a drain of the second metal layer, the data line 64 is electrically connecting with the source and the drain. After forming the data line 64, forming a passivation layer 904 on the source and the drain, the grid insulating layer 902 and the passivation layer 904 are sequentially stacked on the auxiliary electrode 60 to form the insulating layer 90.

In this embodiment, the thin film transistor 20 includes a grid, a grid insulating layer 902, an active layer, a source and a drain and a passivation layer 904 by sequentially stacked. Specifically, the grid insulating layer 902 is positioned between the grid and the active layer for separating the grid and the active layer, which avoid the effect between the grid and the active layer, the passivation layer 904 is covering the source and the drain for protecting the source and the drain and entire thin film transistor 20. In another embodiment, the pixel electrode 50 is formed on the passivation layer 904 and opening an open on the correspondingly position of the source or drain for exposing partially source or drain, and pixel electrode 50 pass through the open to contact source or drain such that achieve to electrically connect the thin film transistor 20 and the pixel electrode 50. In this embodiment, in range of vertical projection of the protrusion section 32 on the first substrate 12, the grid insulating layer 902 and the passivation layer 904 are stacked on the auxiliary electrode 60. Specifically, the auxiliary electrode 60 and the grid are simultaneously formed by patterning the first metal layer which deposited on the first substrate 12. The source and the drain are formed by patterning the second metal layer which deposited on the first substrate 12. And in the covering range of the protrusion section 32, the second metal layer will be etched and removed, so that in the covering range of the protrusion section 32, the passivation layer 904 is positioned on surface of the grid insulating layer 902 and stacking with the grid insulating layer 902 to form an insulating layer 90. In other embodiment, the passivation layer 904 and the grid insulating layer 902 are formed by the same insulating material, or by the different insulating materials. Further, the hole 40 simultaneously passes through the passivation layer 904 and the grid insulating layer 902 for exposing the auxiliary electrode 60.

S104, forming a conducting layer on the first substrate 12, patterning the conducting layer to form a shielding electrode 30, the shielding electrode 30 comprises a main section 34 and a protrusion section 32 are integrated, the main section 34 is located on a lateral side of data line 64 which away the first substrate 12, and vertical projection of the main section 34 on the first substrate 12 is covering the data line 64, the protrusion section 32 is positioned on the insulating layer 90, and the protrusion section 32 pass through the hole 40 and contacting to the auxiliary electrode 60.

Figure 9:
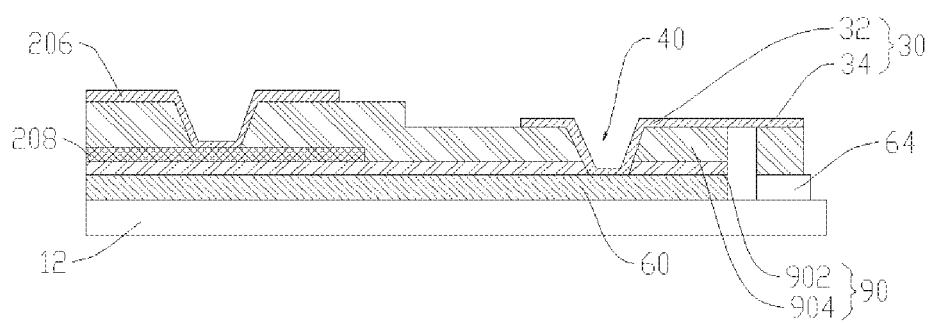
FIG. 9 is a Step S104 schematic view of a method of manufacturing array substrate according to an embodiment of the disclosure.

Please refer to FIG. 9. In this embodiment, the shielding electrode 30 comprises a main section 34 and a protrusion section 32 are integrated, the main section 34 is located on a lateral side of data line 64 which away the first substrate 12, and vertical projection of the main section 34 on the first substrate 12 is covering the data line 64. Further, the data line 64 and the main section 34 are insulating to each other. In other embodiment, the main section 34 is separated by the insulating layer 90. In this embodiment, the main section 34 is a strip-shaped, each of the main sections 34 of the shielding electrode 30 is covering to a data line 64 for reducing light leakage phenomenon from lateral side of curving liquid crystal display panel 200. In this embodiment, the protrusion section 32 is positioned on the insulating layer 90, and the protrusion section 32 pass through the hole 40 and contacting to the auxiliary electrode 60. Specifically, the protrusion section 32 is extending from a lateral side of the main section 34 and along the perpendicular direction of the main section 34. Further, the protrusion section 32 extending along an inner wall of the hole 40 to inside of the hole 40, protrusion section 32 pass through bottom of the hole 40 and contacting to the auxiliary electrode 60 which exposed by the hole 40. In other embodiment, the protrusion section 32 keep along the inner wall of the hole 40 to outside the hole 40 after contacting the auxiliary electrode 60 for enhancing the contacting area between the protrusion section 32 and the auxiliary electrode 60. In other embodiment, vertical projection of the protrusion section 32 on the first substrate 12 is covering the hole 40, in another way, the auxiliary electrode 60 which exposed by the hole 40 is contacting with the protrusion section entirely such that increase the contacting area between the protrusion section 32 and the auxiliary electrode 60.

The main section 34 of the shielding electrode 30 is covering the data line 64 for prevent light leakage from lateral side of liquid crystal display panel 200 caused by curving black matrix. The protrusion section 32 pass through the hole 40 of the insulating layer 90, and contacting and electrically connecting to the auxiliary electrode 60 such that the protrusion section 32 is electrically connecting to the common electrode 16 on the color filter 140 by the auxiliary electrode 60. According to that each of the shielding electrode 30 on the array substrate 100 is electrically connecting to the common electrode 16, and each of the shielding electrodes 30 has same potential which reduces the effect of main section 34 of the shielding electrode 30 by the high/low potential signal on the data line 64, and then the shielding electrode 30 is normally working, and highly product yield and saving production costs.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. An array substrate, comprising
 a first substrate and a data line, the data line positioned on the first substrate;
 an auxiliary electrode positioned on the first substrate, the auxiliary electrode for electrically connecting to a color filter, vertical projection of the auxiliary electrode on the first substrate does not intersect with the data line;
 an insulating layer positioned on a surface of the auxiliary electrode which away the first substrate, the insulating layer has a hole; and
 a shielding electrode comprises a main section and a protrusion section are integrated, the main section is located on a lateral side of data line which away the first substrate, and vertical projection of the main section on the first substrate is covering the data line, the protrusion section is positioned on the insulating layer, and the protrusion section pass through the hole and contacting to the auxiliary electrode.

2. The array substrate according to claim 1, wherein vertical projection of the protrusion section on the first substrate is covering the hole.

3. The array substrate according to claim 2, wherein the array substrate further comprising a pixel electrode positioned on the first substrate, at least partial vertical projection of the auxiliary electrode on the first substrate is positioned between the data line and the pixel electrode, the auxiliary electrode for decreasing effect of the pixel electrode by data line.

4. The array substrate according to claim 3, wherein the insulating layer includes a grid insulating layer and a passivation layer, the grid insulating layer and the passivation layer are sequentially stacked on the auxiliary electrode in vertical projection range of the protrusion section on the first substrate, the first substrate further comprising a thin film transistor, the grid insulating layer is positioned between a grid and a source, a drain of the thin film transistor, the passivation layer is positioned between the source or the drain of the thin film transistor and the pixel electrode.

5. A display panel, comprising a color filter, a crystal liquid layer and an array substrate, the array substrate comprising a first substrate and a data line, the data line positioned on the first substrate; an auxiliary electrode positioned on the first substrate, the auxiliary electrode for electrically connecting to the color filter, vertical projection of the auxiliary electrode on the first substrate does not intersect with the data line; an insulating layer positioned on a surface of the auxiliary electrode which away the first substrate, the insulating layer has a hole; and a shielding electrode comprises a main section and a protrusion section are integrated, the main section is located on a lateral side of data line which away the first substrate, and vertical projection of the main section on the first substrate is covering the data line, the protrusion section is positioned on the insulating layer, and the protrusion section pass through the hole and contacting to the auxiliary electrode; the color filter and the array substrate are corresponding to each other, the crystal liquid layer is positioned between the color filter and the array substrate, and changing deflection of the liquid crystal molecular of the liquid crystal layer according to differential pressure between the array substrate and color filter.

6. The display panel according to claim 5, wherein vertical projection of the protrusion section on the first substrate is covering the hole.

7. The display panel according to claim 6, wherein the array substrate further comprising a pixel electrode positioned on the first substrate, at least partial vertical projection of the auxiliary electrode on the first substrate is positioned between the data line and the pixel electrode, the auxiliary electrode for decreasing effect of the pixel electrode by data line.

8. The display panel according to claim 7, wherein the insulating layer includes a grid insulating layer and a passivation layer, the grid insulating layer and the passivation layer are sequentially stacked on the auxiliary electrode in vertical projection range of the protrusion section on the first substrate, the first substrate further comprising a thin film transistor, the grid insulating layer is positioned between a grid and a source, a drain of the thin film transistor, the passivation layer is positioned between the source or the drain of the thin film transistor and the pixel electrode.

9. A method of manufacturing array substrate, comprising
providing a first substrate, forming a first metal layer on the first substrate, patterning the first metal layer to form an auxiliary electrode, the auxiliary electrode for electrically connecting the color filter;
forming a second metal layer on the first substrate, patterning the second metal layer to form data line, vertical projection of the data line on the first substrate does not intersect with the auxiliary electrode;
forming an insulating layer on a surface of the auxiliary electrode which away the first substrate, and opening a hole on the insulating layer;
forming a conducting layer on the first substrate, patterning the conducting layer to form a shielding electrode, the shielding electrode comprises a main section and a protrusion section are integrated, the main section is located on a lateral side of data line which away the first substrate, and vertical projection of the main section on the first substrate is covering the data line, the protrusion section is positioned on the insulating layer, and the protrusion section pass through the hole and contacting to the auxiliary electrode.

10. The method of manufacturing array substrate according to claim 9, wherein before forming the data line, patterning the first metal layer to form a grid, and forming a grid insulating layer on the grid; while forming the data line, patterning a source and a drain of the second metal layer, the data line is electrically connecting with the source or the drain; after forming the data line, forming a passivation layer on the source and the drain, the grid insulating layer and the passivation layer are sequentially stacked on the auxiliary electrode to form the insulating layer.

11. The method of manufacturing array substrate according to claim 9, wherein while patterning the conducting layer to form the shielding electrode, patterning the conducting layer to form a pixel electrode, at least partial vertical projection of the auxiliary electrode on the first substrate is positioned between the data line and the pixel electrode, the auxiliary electrode for decreasing effect of the pixel electrode by data line.

12. The method of manufacturing array substrate according to claim 9, wherein vertical projection of the protrusion section on the first substrate is covering the hole.

* * * * *